United States Patent
Mardi

(10) Patent No.: US 8,542,029 B1
(45) Date of Patent: Sep. 24, 2013

(54) METHODS AND APPARATUS FOR TESTING OF INTEGRATED CIRCUITS

(75) Inventor: Mohsen Hossein Mardi, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 793 days.

(21) Appl. No.: 12/368,841

(22) Filed: Feb. 10, 2009

(51) Int. Cl.
*G01R 31/02* (2006.01)
*G01R 31/20* (2006.01)

(52) U.S. Cl.
USPC .................................. 324/762.01; 324/757.01

(58) Field of Classification Search
USPC .......................................... 324/158.1, 750.19
See application file for complete search history.

(56) References Cited

U.S. PATENT DOCUMENTS

| | | | | |
|---|---|---|---|---|
| 4,517,512 A | * | 5/1985 | Petrich et al. .................. | 714/724 |
| 5,047,711 A | * | 9/1991 | Smith et al. ................ | 324/750.06 |
| 5,627,647 A | * | 5/1997 | Baan et al. ..................... | 356/625 |
| 5,644,245 A | * | 7/1997 | Saitoh et al. .............. | 324/750.18 |
| 6,257,319 B1 | * | 7/2001 | Kainuma et al. ............. | 165/11.1 |
| 6,414,325 B1 | * | 7/2002 | Yamada et al. ............ | 250/491.1 |
| 7,034,272 B1 | * | 4/2006 | Leonard et al. ............ | 250/208.1 |
| 7,271,385 B2 | * | 9/2007 | Gunji et al. .................... | 250/310 |
| 7,710,582 B2 | * | 5/2010 | Koga et al. .................... | 356/600 |
| 7,797,128 B2 | * | 9/2010 | Ashford et al. ............... | 702/166 |
| 2008/0070480 A1 | * | 3/2008 | Nomiya .......................... | 451/22 |

\* cited by examiner

*Primary Examiner* — Vinh Nguyen
(74) *Attorney, Agent, or Firm* — Robert M. Brush; Gerald Chan

(57) ABSTRACT

Methods and apparatus for testing packaged ICs are disclosed. In some embodiments, an apparatus for testing a packaged integrated circuit (IC) can include a pre-test station having a height detection system configured to detect a height of a packaged IC when disposed therein prior to testing; a testing station for testing the packaged IC received from the pre-test station; and a device handler for moving the packaged IC to the testing station. In some embodiments, a method for testing packaged ICs may include detecting a height of a packaged IC to be tested disposed in a pre-test station; comparing the height to an expected height; and determining whether the detected height of the packaged IC is different than the expected height of the packaged IC by greater than or equal to a desired amount.

19 Claims, 2 Drawing Sheets

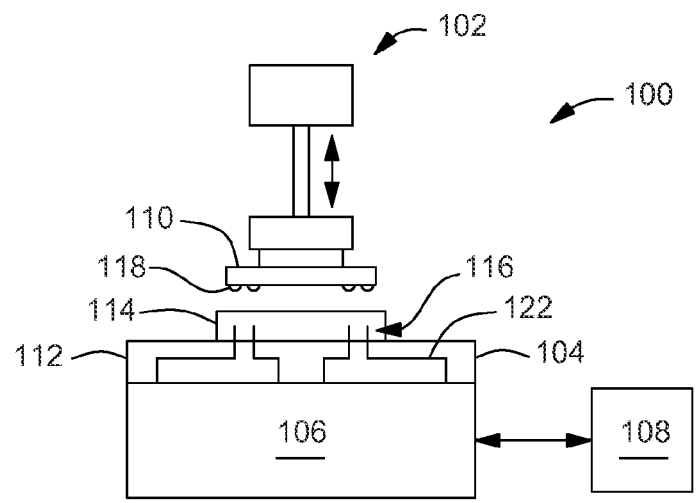
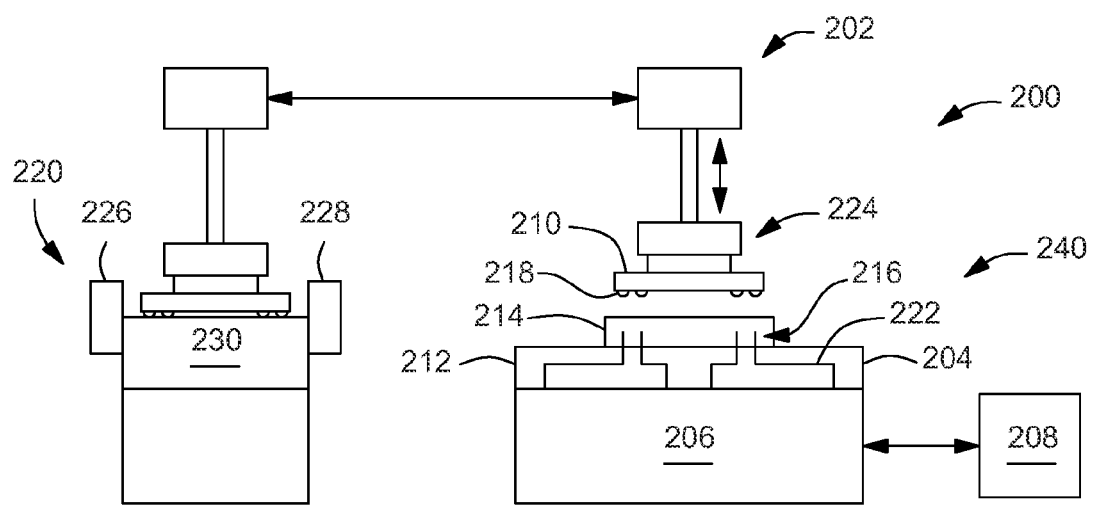
FIG. 1
(PRIOR ART)
FIG. 2

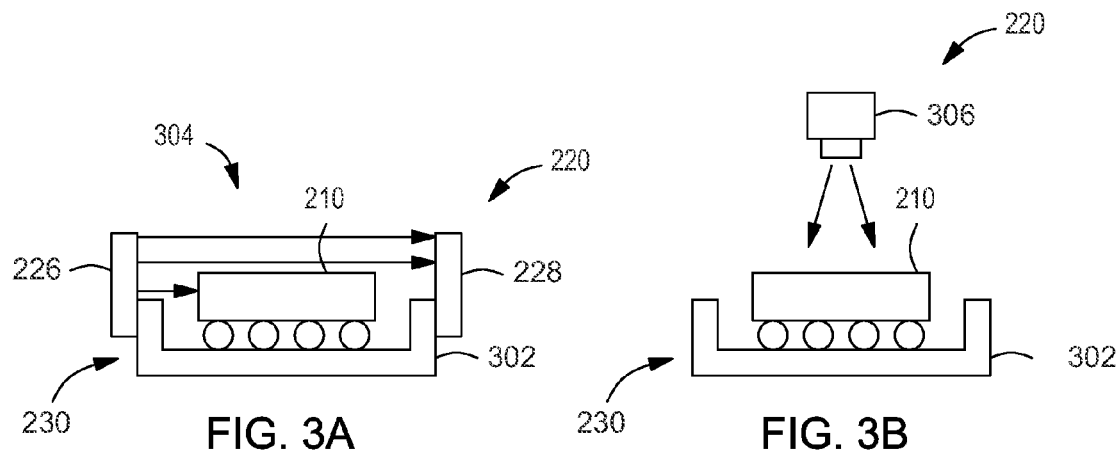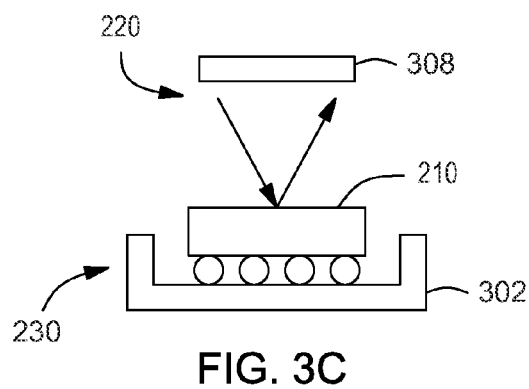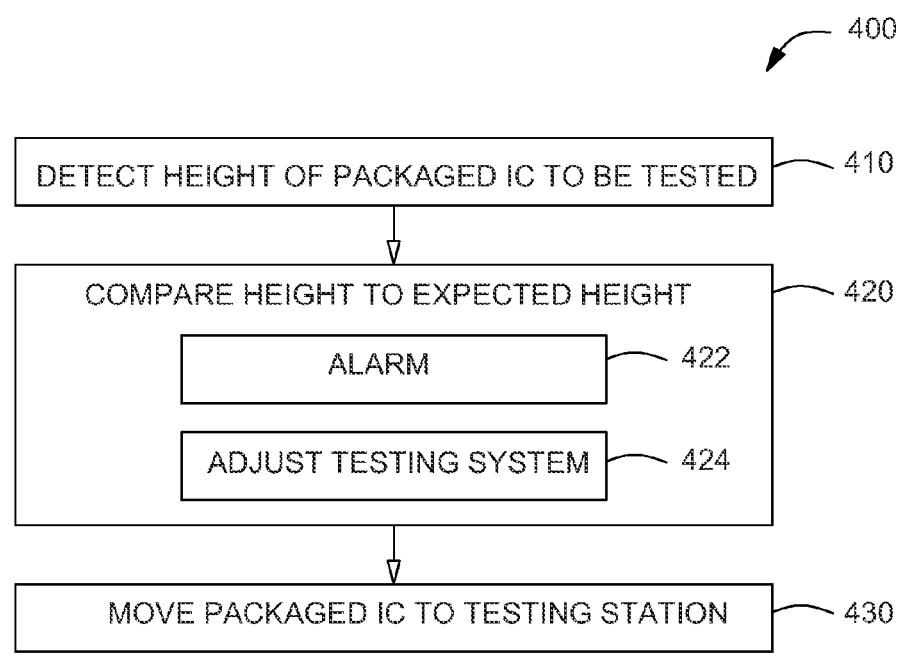

METHODS AND APPARATUS FOR TESTING OF INTEGRATED CIRCUITS

FIELD OF THE INVENTION

One or more aspects of the present invention relate generally to integrated circuits (ICs) and, more particularly, to methods and apparatus for testing of ICs.

BACKGROUND OF THE INVENTION

Integrated circuit (IC) manufacturers typically test their IC packages before shipping to customers using IC testing systems. A typical IC testing system 100, depicted in FIG. 1, includes a device handler 102, an interface structure 104, a device tester 106, and a computer 108. The device handler 102 is a precise robot that is utilized to move a device under test (DUT) 110, such as a packaged IC device, to, from, and within the testing system 100 (for example, between a storage area and the interface structure 104).

The interface structure 104 includes a printed circuit board (PCB) 112 having a socket 114 located in a central test area. The PCB 112 is of a size and shape that allows it to be received into a docking area of the device tester 106. The socket 114 includes a plurality of compressible pins such as pogo pins 116 arranged so as to contact corresponding balls 118 of the DUT 110 (e.g., the arrangement of pogo pins 116 of the socket 114 corresponds to the arrangement of balls 118 of the DUT 110).

The PCB 112 includes conductive contacts (not shown) disposed on a bottom surface thereof. The conductive contacts couple corresponding pogo pins 116 of the socket 114 to a plurality of test probes (not shown) of the device tester 106 by conductive lines 122 (e.g., metal traces). The plurality of test probes provide test signals to the interface structure 104, which in turn transmits signals between the device tester 106 and the leads (e.g., solder balls 118) of the DUT 110.

The computer 108 is coupled to the device tester 106. The computer 108 may be, for example, a personal computer (PC) or other suitable controller for controlling the testing system 100 and includes well-known testing software residing in memory (e.g., a system memory or a hard disk). The testing software provides test and control signals to device tester 106 according to test parameters associated with the DUT 110. The test parameters may be stored in a file located in computer memory, or may be input into the computer 108 using any suitable input device such as, for example, a keyboard (not shown).

In operation, the DUT 110 is mounted on the socket 114 (for example, using the device handler 102) so that the solder balls 118 contact the pogo pins 116 of the socket 114. The device handler 102 is configured to apply a pre-determined force against the DUT 110 based upon the height of the DUT 110. However, standard IC package sizes allow for a variety of heights for a given package size. For example, a 1 by 1 inch package can have a height that varies between about 0.25 to about 0.5 inches. Typically, device packages of a given size (e.g., x by y) utilize the same device handler and change kit for the testing system 100, even though there is a large variation in package heights (e.g., z direction). As such, damage to the packages being tested and/or the equipment may occur if the testing system is set up for processing smaller height packages and larger packages are actually being tested. Although some systems contain sensors for detecting stacked packages (e.g., two packages stacked atop each other), such sensors do not detect the height of the stacked packages.

Accordingly, there exists a need in the art for improved methods and apparatus for testing ICs.

SUMMARY OF THE INVENTION

Methods and apparatus for testing packaged ICs are provided herein. In some embodiments, an apparatus for testing a packaged integrated circuit (IC) can include a pre-test station having a height detection system configured to detect a height of a packaged IC when disposed therein prior to testing; a testing station for testing the packaged IC received from the pre-test station; and a device handler for moving the packaged IC to the testing station.

In addition, the device handler can move the packaged IC from the pre-test station to the testing station.

Furthermore, the testing station includes a device interface having a socket configured to receive the contacts of the packaged IC, a device tester having test probes for connecting with the contacts of the packaged IC through the device interface, and a computer to control testing of the packaged IC.

The height detection system is further configured to provide an alarm if the detected height of the packaged IC is different than an expected height of the packaged IC by greater than or equal to a pre-determined amount. In addition, the height detection system is configured to stop at least one of the testing station and the device handler if the detected height of the packaged IC is different than an expected height of the packaged IC by greater than or equal to a pre-determined amount. Moreover, the height detection system is further configured to alter the settings of at least one of the testing station and the device handler to correspond to the detected height of the IC package if the detected height of the packaged IC is different than an expected height of the packaged IC by greater than or equal to a pre-determined amount.

The pre-test station comprises a heat soak station, a pre-sizing station, a contact area, a storage area, an alignment area, a queue, or an input area to the testing station.

The height detection system further includes a light source to provide a beam of light towards the packaged IC when disposed in the pre-test station, and a sensor to detect at least a portion of the beam of light passing the packaged IC or reflected off of the packaged IC.

The light source is configured to provide the beam of light towards a side of the packaged IC, and the sensor is configured to detect a portion of the beam of light not obstructed by the packaged IC.

In addition, the height detection system further includes a camera having a source configured to direct a beam of light onto a back surface of the packaged IC when disposed in the pre-test station, and a sensor configured to detect a portion of the beam of light reflected off of the packaged IC. In addition, the height detection system further includes a laser sensor having a source configured to direct a focused beam of light onto a back surface of the packaged IC when disposed in the pre-test station and a sensor configured to detect a portion of the beam of light reflected off of the packaged IC.

In some embodiments, a method for testing packaged ICs may include detecting a height of a packaged IC to be tested disposed in a pre-test station; comparing the height to an expected height; and determining whether the detected height of the packaged IC is different than the expected height of the packaged IC by greater than or equal to a desired amount.

In addition, the method further includes moving the packaged IC from the pre-test station to a testing station using a device handler. Further, the method includes providing an alarm if the detected height of the packaged IC is different than an expected height of the packaged IC by greater than or equal to a pre-determined amount. The method also includes stopping at least one of the testing station and the device handler if the detected height of the packaged IC is different than an expected height of the packaged IC by greater than or equal to the pre-determined amount.

Moreover, the method includes altering the settings of at least one of the testing station and the device handler to correspond to the detected height of the IC package if the detected height of the packaged IC is different than the expected height of the packaged IC by greater than or equal to a pre-determined amount.

The pre-test station, described earlier, includes a heat soak station, a pre-sizing station, a contact area, a storage area, an alignment area, a queue, or an input area to a testing station.

The element of detecting the height of the packaged IC includes providing a beam of light towards the packaged IC when disposed in the pre-test station; and detecting at least a portion of the beam of light passing the packaged IC or reflected off of the packaged IC. The beam of light is provided to a side of the packaged IC, and a sensor is configured to detect a portion of the beam of light not obstructed by the packaged IC. Alternatively, the beam of light is reflected off of an upper surface of the packaged IC, and a sensor is provided and configured to detect the reflected beam of light.

BRIEF DESCRIPTION OF THE DRAWINGS

The accompanying drawing(s) show embodiment(s) in accordance with one or more aspects of the invention. However, the accompanying drawing(s) should not be taken to limit the invention to the embodiment(s) shown, but are for explanation and understanding only.

FIG. 1 is a schematic diagram depicting a conventional integrated circuit (IC) testing system.

FIG. 2 is a schematic diagram depicting an integrated circuit (IC) testing system according to some embodiments of the invention.

FIGS. 3A, 3B, and 3C are embodiments of a pretest station according to some embodiments of the invention.

FIG. 4 is a flow diagram of a method for testing an integrated circuit according to some embodiments of the invention.

DETAILED DESCRIPTION

Methods and apparatus for testing integrated circuits (ICs) are provided herein. The inventive methods and apparatus advantageously facilitate testing packaged ICs with reduced incidence of damage to the package. The inventive methods and apparatus thus facilitate providing improved yield and uptime of testing systems.

FIG. 2 depicts an IC testing system 200 in accordance with some embodiments of the present invention. As shown in FIG. 2, the IC testing system 200 includes a device handler 202, a pre-test station 230, and a testing station 240. The device handler 202 is a precision movable robot configured to position a device under test (DUT) 210, such as a packaged IC device, to, from, and within the testing system 200 (for example, between the pre-test station 230 and the testing station 240). The device handler 202 is generally movable in at least an x and z direction (e.g., horizontally and vertically), and optionally, in a y direction (e.g., horizontally in a direction normal to the x direction). The device handler 202 includes a pickup head 224 configured to detachably couple to the backside of the DUT 210 (for example, by vacuum). The device handler 202 may be utilized to pick up the DUT 210 with the pickup head 224 and moves the DUT 210 to a desired position in the testing system 200.

The pre-test station 230 may be any of a number of stations where the DUT 210 may be stored and/or processed prior to testing. Such stations may be disposed in a separate location from the testing station 240 (e.g., a standalone system, as depicted in FIG. 2) or may be part of the same equipment as the testing station 240 (e.g., the pre-test station 230 may be in-line with the testing station 240). For example, non-limiting examples of suitable pre-test stations include heat soak stations, a DUT pre-sizing station, a contact area, a storage area, a DUT alignment area, a queue or input area to the testing station, or the like. As such, the pre-test station 230 may be a location where the DUT 210 is stored, aligned, or queued up prior to testing, or the pre-test station 230 may be a location where the DUT 210 is processed, such as by pre-heating, pre-sizing, or the like.

The pre-test station 230 includes a height detection system 220 for detecting the height of the package (e.g., DUT 210) when disposed in the pre-test station 230. For example, as depicted in FIG. 2, the height detection system 220 may include a light source 226 and a sensor 228 configured to respectively send and receive a beam of light that may be partially obscured or broken by the presence of the DUT 210 in the pre-test station 230. As shown in greater detail in FIG. 3A, height detection system may be configured to detect the height of a DUT 210 disposed on a surface of a body 302 of the pre-test station 230. The light source 226 may be mounted on the body 302 (or otherwise disposed) to provide a beam of light (arrows 304) that may be partially obscured by the DUT 210. The sensor 228 may also be mounted on the body 302, or otherwise suitably disposed, to receive the beam of light from the light source 226.

The height detection system 220 may calculate the height of the DUT 210 based upon the amount of light obscured by the DUT 210. For example, the sensor may be coupled to a computer (such as computer 208, discussed below) that may calculate the height of the DUT 210 based upon data received from the sensor 228. The calculated height of the DUT 210 may be compared to an expected height of the DUT 210 (such as may be programmed or set up in the testing station 240). In some embodiments, in response to the calculated height being different than the expected height of the DUT 210 by greater than or equal to a pre-determined amount, the height detection system 220 may cause an alarm to be displayed and/or sounded, may automatically stop the testing station 240 and/or the device handler 202, may automatically adjust the setup of the testing station 240 and/or the handler 202, the DUT 210 may be placed in a reject tray or location, or the like.

In some embodiments, and as depicted in FIG. 3B, the height detection system 220 may include a camera 306 disposed above the DUT 210, rather than the light source 226 and the sensor 228. The camera 306 includes a light source that may direct light onto the surface of the DUT 210 and a sensor that detects at least a portion of the light reflected therefrom. The camera 306 may then calculate the height of the DUT 210 based upon the light reflected off of the DUT 210. Alternatively, the camera 306 may be another optical source/sensor, such as a laser sensor or other source of a focused beam of light and sensor for detecting light reflected off of the DUT 210 (such as laser sensor 308 depicted in FIG. 3C). The camera 306 and/or the laser sensor 308 may calculate the height of the DUT 210 internally or by sending data to a computer (such as computer 208 discussed below), and may otherwise operate as discussed above.

The above non-limiting examples of the pre-test station 230 are provided for illustration only and other embodiments are within the scope of the present invention. For example, the light sources and sensors may be disposed in locations other than as shown above, such placing the camera 306 (or laser sensor) on the side of the DUT 210 (as shown in FIG. 3A) or above the DUT 210 at an angle thereto, or any other suitable location where a beam of light may be reflected by, or partially obscured by, the DUT 210 such that the height of the DUT 210 may be calculated.

Returning to FIG. 2, in some embodiments, the testing station 240 may include an interface structure 204, a device tester 206, and a computer 208. The interface structure 204 includes a printed circuit board (PCB) 212 having a socket 214 located in a central test area. The PCB 212 is of a size and shape that allows it to be received into a docking area of the device tester 206. The socket 214 includes a plurality of compressible pins such as pogo pins 216 arranged so as to contact corresponding balls 218 of the DUT 210. The arrangement of pogo pins 216 of the socket 214 corresponds to the arrangement of balls 218 of the DUT 210.

The PCB 212 includes conductive contacts (not shown) disposed on a bottom surface thereof. The conductive contacts couple corresponding pogo pins 216 of the socket 214 to a plurality of test probes (not shown) of the device tester 206 by conductive lines 222 (e.g., metal traces). The plurality of test probes provide test signals to the interface structure 204, which in turn transmits signals between the device tester 206 and the leads (e.g., solder balls 218) of the DUT 210.

The computer 208 is coupled to the device tester 206. The computer 208 may be, for example, a personal computer (PC) or other suitable controller for controlling the testing station 240 and/or the entire testing system 200. The computer 208 includes testing software residing in memory (e.g., a system memory or a hard disk) for testing the DUT 210. For example, the testing software may provide test and control signals to the device tester 206 according to test parameters associated with the DUT 210. The test parameters may be stored in a file located in computer memory, or may be input into the computer 208 using any suitable input device such as, for example, a keyboard (not shown).

In some embodiments, the computer 208 may be coupled to the height detection system 220, or may be a part of the height detection system 220 (e.g., the computer 208 may be a part of both the testing system 208 and the height detection system 220). In some embodiments, the computer 208 may receive data from the height detection system 220 to calculate the height of the DUT 210. Alternatively, the computer 208 may receive a signal indicative of the height of the DUT 210 as calculated directly by the height detection system 220.

FIG. 4 depicts a method 400 for testing a packaged IC in accordance with some embodiments of the present invention. The method 400 generally begins at 410 where a height of a packaged IC (e.g., the DUT 210) to be tested is detected. The height of the packaged IC may be detected using any of the embodiments of the height detection system 220, as discussed above. For example, light may be directed towards the packaged IC, for example from the sides (as depicted in FIG. 3A), or above (as depicted in FIGS. 3B and 3C), or from any suitable angle such that a portion of the light may be detected by a sensor (e.g., sensor 226, camera 306, laser sensor 308, or the like). The sensor may then calculate the height of the packaged IC, or may send a signal that is indicative of the amount of light, angle of light, focal length, or the like, or that is otherwise correlated to the height of the packaged IC to the computer 208 so that the computer 208 may calculate the height of the packaged IC.

Next, at 420, the calculated height of the packaged IC may be compared to an expected height of the packaged IC (such as may be programmed or set up in the testing station 240). The calculated height of the packaged IC may be compared to the expected height of the packaged IC, for example, by the computer 208. In comparing the calculated height of the packaged IC to the expected height, it may be determined whether the detected height of the packaged IC is different than the expected height of the packaged IC by greater than or equal to a desired amount. In some embodiments, in response to the calculated height being different than the expected height of the packaged IC by greater than or equal to a predetermined amount, the computer 208 may provide one or more actions. For example, in some embodiments, the computer 208 may cause an alarm to be displayed and/or sounded (as depicted at 422). The alarm may be a display on a screen of the computer, a flashing light, an audible alarm, or the like, or combinations thereof.

Alternatively or in combination, the computer 208 may automatically stop the testing station 240 and/or the device handler 202, or may automatically adjust the setup of the testing station 240 and/or the handler 202, or the like (as depicted at 424). For example, the calculated height of the packaged IC may be different than expected by greater than a desired amount due to an error in the setup of the testing station 240. As such, in some embodiments, the computer 208 may stop the testing station 240 and/or the device handler 202 from operating until a manual adjustment or override decision is made. In some embodiments, the computer 208 may automatically adjust the setup of the testing station 240 and/or the handler 202 to a setup corresponding to the calculated height of the packaged IC, thereby avoiding human intervention and limiting system downtime. Such setup of the testing station 240 and/or the handler 202 may include changes such as, but not limited to, testing protocols, physical setup of the testing station 240, a stroke length of the device handler 202, a pressure applied against the packaged IC by the device handler 202, or the like.

Upon confirmation that the calculated height of the packaged IC is within a suitable tolerance of the expected height of the packaged IC, or upon resolution of the calculated height of the packaged IC being different than the expected height, the packaged IC may be moved to the testing station 240, at 430. The packaged IC can then be tested, for example, using testing software residing in memory of the computer 208, as discussed above.

Thus, methods and apparatus for testing packaged ICs has been provided. The inventive methods and apparatus may advantageously reduce the incidence of damage to the packaged ICs due to incorrect setting in a testing system. In some embodiments, the inventive apparatus provides automated package height detection and confirmation or system setup to avoid damage to the packaged ICs.

While the foregoing describes embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. An apparatus for testing a packaged integrated circuit (IC), comprising:
a pre-test station having a height detection system configured to detect a height of a packaged IC when disposed therein prior to testing, and to compare the detected height of the packaged IC with an expected height of the packaged IC to determine whether there is a height error;

a testing station for testing the packaged IC received from the pre-test station if the pre-test station determines that there is no height error; and a device handler for moving the packaged IC to the testing station.

2. The apparatus of claim 1, wherein the device handler moves the packaged IC from the pre-test station to the testing station.

3. The apparatus of claim 1, wherein the testing station comprises:

a device interface having a socket configured to receive the contacts of the packaged IC;

a device tester having a plurality of test probes for connecting with the contacts of the packaged IC through the device interface; and a computer to control testing of the packaged IC.

4. The apparatus of claim 1, wherein the height detection system is further configured to provide an alarm if the detected height of the packaged IC is different than the expected height of the packaged IC by greater than or equal to a pre-determined amount.

5. The apparatus of claim 1, wherein the height detection system is further configured to stop at least one of the testing station and the device handler if the detected height of the packaged IC is different than the expected height of the packaged IC by greater than or equal to a pre-determined amount.

6. The apparatus of claim 1, wherein the height detection system is further configured to alter the settings of at least one of the testing station and the device handler to correspond to the detected height of the IC package if the detected height of the packaged IC is different than the expected height of the packaged IC by greater than or equal to a pre-determined amount.

7. The apparatus of claim 1, wherein the pre-test station comprises a heat soak station, a pre-sizing station, a contact area, a storage area, an alignment area, a queue, or an input area to the testing station.

8. The apparatus of claim 1, wherein the height detection system further comprises:

a light source to provide a beam of light towards the packaged IC when disposed in the pre-test station; and a sensor to detect at least a portion of the beam of light passing the packaged IC or reflected off of the packaged IC.

9. The apparatus of claim 8, wherein the light source is configured to provide the beam of light towards a side of the packaged IC, and wherein the sensor is configured to detect a portion of the beam of light not obstructed by the packaged IC.

10. The apparatus of claim 1, wherein the height detection system further comprises:

a camera having a source configured to direct a beam of light onto a back surface of the packaged IC when disposed in the pre-test station and a sensor configured to detect a portion of the beam of light reflected off of the packaged IC.

11. The apparatus of claim 1, wherein the height detection system further comprises:

a laser sensor having a source configured to direct a focused beam of light onto a back surface of the packaged IC when disposed in the pre-test station and a sensor configured to detect a portion of the beam of light reflected off of the packaged IC.

12. A method for testing a packaged IC, comprising:

detecting a height of a packaged IC to be tested when disposed in a pre-test station;

comparing the height to an expected height of the packaged IC;

determining whether there is a height error based on whether a difference between the detected height of the packaged IC and the expected height of the packaged IC is greater than or equal to a pre-determined amount;

moving the packaged IC from the pre-test station to a testing station using a device handler; and testing the packaged IC, if a result from the act of determining indicates there is no height error.

13. The method of claim 12, further comprising:

providing an alarm if the difference between the detected height of the packaged IC and the expected height of the packaged IC is greater than or equal to the pre-determined amount.

14. The method of claim 12, further comprising:

stopping at least one of the testing station and the device handler if the difference between the detected height of the packaged IC and the expected height of the packaged IC is greater than or equal to the pre-determined amount.

15. The method of claim 12, further comprising:

altering the settings of at least one of the testing station and the device handler to correspond to the detected height of the IC package if the difference between the detected height of the packaged IC and the expected height of the packaged IC is greater than or equal to the pre-determined amount.

16. The method of claim 12, wherein the pre-test station comprises a heat soak station, a pre-sizing station, a contact area, a storage area, an alignment area, a queue, or an input area to a testing station.

17. The method of claim 12, wherein detecting the height of the packaged IC comprises:

providing a beam of light towards the packaged IC when disposed in the pre-test station; and detecting at least a portion of the beam of light passing the packaged IC or reflected off of the packaged IC.

18. The method of claim 17, wherein the beam of light is provided to a side of the packaged IC, and wherein a sensor is configured to detect a portion of the beam of light not obstructed by the packaged IC.

19. The method of claim 17, wherein the beam of light is reflected off of an upper surface of the packaged IC, and wherein a sensor is provided and configured to detect the reflected beam of light.

* * * * *